United States Patent
Cowan et al.

(10) Patent No.: US 7,292,057 B2
(45) Date of Patent: **\*Nov. 6, 2007**

(54) PROBE STATION THERMAL CHUCK WITH SHIELDING FOR CAPACITIVE CURRENT

(75) Inventors: Clarence E. Cowan, Newberg, OR (US); Paul A. Tervo, Vancouver, WA (US); John L. Dunklee, Tigard, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/546,827

(22) Filed: Oct. 11, 2006

(65) Prior Publication Data

US 2007/0030021 A1 Feb. 8, 2007

Related U.S. Application Data

(63) Continuation of application No. 10/626,903, filed on Jul. 25, 2003, now Pat. No. 7,138,813, which is a continuation of application No. 10/308,847, filed on Dec. 2, 2002, now Pat. No. 6,642,732, which is a continuation of application No. 10/179,771, filed on Jun. 24, 2002, now Pat. No. 6,512,391, which is a continuation of application No. 09/345,571, filed on Jun. 30, 1999, now Pat. No. 6,445,202.

(51) Int. Cl.
*G01R 31/02* (2006.01)
*G01R 31/26* (2006.01)

(52) U.S. Cl. ............ 324/760; 324/627; 324/754

(58) Field of Classification Search .......... 324/760, 324/754–765
See application file for complete search history.

(56) References Cited

U.S. PATENT DOCUMENTS

| | | | |
|---|---|---|---|
| 1,337,868 A | 4/1920 | Whitaker |
| 2,142,625 A | 1/1939 | Zoethout |
| 2,197,081 A | 4/1940 | Piron |
| 2,376,101 A | 5/1945 | Tyzzer |

(Continued)

FOREIGN PATENT DOCUMENTS

DE 29 12 826 10/1980

(Continued)

OTHER PUBLICATIONS

Christophe Risacher, Vessen Vassilev, Alexey Pavolotsky, and Victor Belitsky, "Waveguide-to-Microstrip Transition With Integrated Bias-T," IEEE Microwave and Wireless Components Letters, vol. 13, No. 7, Jul. 2003, pp. 282-284.

(Continued)

*Primary Examiner*—Vinh Nguyen
*Assistant Examiner*—Emily Y Chan
(74) *Attorney, Agent, or Firm*—Chernoff, Vilhauer, McClung & Stenzel, LLP

(57) ABSTRACT

To reduce noise in measurements obtained by probing a device supported on surface of a thermal chuck in a probe station, a conductive member is arranged to intercept current coupling the thermal unit of the chuck to the surface supporting the device. The conductive member is capacitively coupled to the thermal unit but free of direct electrical connection thereto.

8 Claims, 5 Drawing Sheets

U.S. PATENT DOCUMENTS

| | | |
|---|---|---|
| 2,389,668 A | 11/1945 | Johnson |
| 2,471,897 A | 5/1949 | Rappl |
| 2,812,502 A | 11/1957 | Doherty |
| 3,176,091 A | 3/1965 | Hanson et al. |
| 3,185,927 A | 5/1965 | Margulis et al. |
| 3,192,844 A | 7/1965 | Szasz et al. |
| 3,193,712 A | 7/1965 | Harris |
| 3,201,721 A | 8/1965 | Voelcker |
| 3,230,299 A | 1/1966 | Radziejowski |
| 3,256,484 A | 6/1966 | Terry |
| 3,265,969 A | 8/1966 | Catu |
| 3,289,046 A | 11/1966 | Carr |
| 3,333,274 A | 7/1967 | Forcier |
| 3,405,361 A | 10/1968 | Kattner et al. |
| 3,408,565 A | 10/1968 | Frick et al. |
| 3,435,185 A | 3/1969 | Gerard |
| 3,484,679 A | 12/1969 | Hodgson et al. |
| 3,596,226 A | 7/1971 | Reed, Jr. et al. |
| 3,602,845 A | 8/1971 | Agrios et al. |
| 3,609,539 A | 9/1971 | Gunthert |
| 3,648,169 A | 3/1972 | Wiesler |
| 3,654,573 A | 4/1972 | Graham |
| 3,662,318 A | 5/1972 | Decuyper |
| 3,710,251 A | 1/1973 | Hagge et al. |
| 3,714,572 A | 1/1973 | Ham et al. |
| 3,775,644 A | 11/1973 | Cotner et al. |
| 3,777,260 A | 12/1973 | Davies et al. |
| 3,810,017 A | 5/1974 | Wiesler et al. |
| 3,814,888 A | 6/1974 | Bowers et al. |
| 3,829,076 A | 8/1974 | Sofy |
| 3,863,181 A | 1/1975 | Glance et al. |
| 3,866,093 A | 2/1975 | Kusters et al. |
| 3,930,809 A | 1/1976 | Evans |
| 3,936,743 A | 2/1976 | Roch |
| 3,970,934 A | 7/1976 | Aksu |
| 3,996,517 A | 12/1976 | Fergason et al. |
| 4,001,685 A | 1/1977 | Roch |
| 4,008,900 A | 2/1977 | Khoshaba |
| 4,009,456 A | 2/1977 | Hopfer |
| 4,027,253 A | 5/1977 | Chiron et al. |
| 4,035,723 A | 7/1977 | Kvaternik |
| 4,038,894 A | 8/1977 | Knibbe et al. |
| 4,042,119 A | 8/1977 | Hassan et al. |
| 4,049,252 A | 9/1977 | Bell |
| 4,066,943 A | 1/1978 | Roch |
| 4,093,988 A | 6/1978 | Scott |
| 4,099,120 A | 7/1978 | Aksu |
| 4,115,735 A | 9/1978 | Stanford |
| 4,115,736 A | 9/1978 | Tracy |
| 4,116,523 A | 9/1978 | Coberly et al. |
| 4,151,465 A | 4/1979 | Lenz |
| 4,161,692 A | 7/1979 | Tarzwell |
| 4,172,993 A | 10/1979 | Leach |
| 4,186,338 A | 1/1980 | Fichtenbaum |
| 4,275,446 A | 6/1981 | Blaess |
| 4,280,112 A | 7/1981 | Eisenhart |
| 4,284,033 A | 8/1981 | del Rio |
| 4,284,682 A | 8/1981 | Frosch et al. |
| 4,287,473 A | 9/1981 | Sawyer |
| 4,342,958 A | 8/1982 | Russell |
| 4,346,355 A | 8/1982 | Tsukii |
| 4,352,061 A | 9/1982 | Matrone |
| 4,357,575 A | 11/1982 | Uren et al. |
| 4,365,109 A | 12/1982 | O'Loughlin |
| 4,365,195 A | 12/1982 | Stegens |
| 4,371,742 A | 2/1983 | Manly |
| 4,376,920 A | 3/1983 | Smith |
| 4,383,178 A | 5/1983 | Shibata et al. |
| 4,414,638 A | 11/1983 | Talambiras |
| 4,419,626 A | 12/1983 | Cedrone et al. |
| 4,425,395 A | 1/1984 | Negishi et al. |
| 4,426,619 A | 1/1984 | Demand |
| 4,473,798 A | 9/1984 | Cedrone et al. |
| 4,479,690 A | 10/1984 | Inouye et al. |
| 4,480,223 A | 10/1984 | Aigo |
| 4,487,996 A | 12/1984 | Rabinowitz et al. |
| 4,491,173 A | 1/1985 | Demand |
| 4,503,335 A | 3/1985 | Takahashi |
| 4,507,602 A | 3/1985 | Aguirre |
| 4,528,504 A | 7/1985 | Thornton, Jr. et al. |
| 4,531,474 A | 7/1985 | Inuta |
| 4,532,423 A | 7/1985 | Tojo et al. |
| 4,557,599 A | 12/1985 | Zimring |
| 4,566,184 A | 1/1986 | Higgins et al. |
| 4,567,321 A | 1/1986 | Harayama |
| 4,567,908 A | 2/1986 | Bolsterli |
| 4,575,676 A | 3/1986 | Palkuti |
| 4,588,970 A | 5/1986 | Donecker et al. |
| 4,621,169 A | 11/1986 | Petinelli et al. |
| 4,626,618 A | 12/1986 | Takaoka et al. |
| 4,642,417 A | 2/1987 | Ruthrof et al. |
| 4,646,005 A | 2/1987 | Ryan |
| 4,665,360 A | 5/1987 | Phillips |
| 4,673,839 A | 6/1987 | Veenendaal |
| 4,675,600 A | 6/1987 | Gergin |
| 4,680,538 A | 7/1987 | Dalman et al. |
| 4,684,883 A | 8/1987 | Ackerman et al. |
| 4,691,831 A | 9/1987 | Suzuki et al. |
| 4,694,245 A | 9/1987 | Frommes |
| 4,695,794 A | 9/1987 | Bargett et al. |
| 4,697,143 A | 9/1987 | Lockwood et al. |
| 4,703,433 A | 10/1987 | Sharrit |
| 4,711,563 A | 12/1987 | Lass |
| 4,712,370 A | 12/1987 | MacGee |
| 4,727,637 A | 3/1988 | Buckwitz et al. |
| 4,730,158 A | 3/1988 | Kasai et al. |
| 4,731,577 A | 3/1988 | Logan |
| 4,734,872 A | 3/1988 | Eager et al. |
| 4,739,259 A | 4/1988 | Hadwin et al. |
| 4,744,041 A | 5/1988 | Strunk et al. |
| 4,755,746 A | 7/1988 | Mallory et al. |
| 4,755,874 A | 7/1988 | Esrig et al. |
| 4,757,255 A | 7/1988 | Margozzi |
| 4,758,785 A | 7/1988 | Rath |
| 4,759,712 A | 7/1988 | Demand |
| 4,771,234 A | 9/1988 | Cook et al. |
| 4,772,846 A | 9/1988 | Reeds |
| 4,777,434 A | 10/1988 | Miller et al. |
| 4,783,625 A | 11/1988 | Harry et al. |
| 4,784,213 A | 11/1988 | Eager et al. |
| 4,786,867 A | 11/1988 | Yamatsu |
| 4,787,752 A | 11/1988 | Fraser et al. |
| 4,791,363 A | 12/1988 | Logan |
| 4,810,981 A | 3/1989 | Herstein |
| 4,812,754 A | 3/1989 | Tracy et al. |
| 4,816,767 A | 3/1989 | Cannon et al. |
| 4,818,169 A | 4/1989 | Schram et al. |
| 4,827,211 A | 5/1989 | Strid et al. |
| 4,838,802 A | 6/1989 | Soar |
| 4,839,587 A | 6/1989 | Flatley et al. |
| 4,845,426 A | 7/1989 | Nolan et al. |
| 4,849,689 A | 7/1989 | Gleason |
| 4,853,613 A | 8/1989 | Sequeira et al. |
| 4,856,426 A | 8/1989 | Wirz |
| 4,856,904 A | 8/1989 | Akagawa |
| 4,858,160 A | 8/1989 | Strid et al. |
| 4,859,989 A | 8/1989 | McPherson |
| 4,871,883 A | 10/1989 | Guiol |
| 4,871,965 A | 10/1989 | Elbert et al. |
| 4,884,026 A | 11/1989 | Hayakawa et al. |
| 4,884,206 A | 11/1989 | Mate |
| 4,888,550 A | 12/1989 | Reid |
| 4,893,914 A | 1/1990 | Hancock et al. |
| 4,894,612 A | 1/1990 | Drake et al. |

| | | | | | |
|---|---|---|---|---|---|
| 4,896,109 A | 1/1990 | Rauscher | 5,369,370 A | 11/1994 | Stratmann et al. |
| 4,899,998 A | 2/1990 | Teramachi | 5,371,457 A | 12/1994 | Lipp |
| 4,904,933 A | 2/1990 | Snyder et al. | 5,373,231 A | 12/1994 | Boll et al. |
| 4,904,935 A | 2/1990 | Calma et al. | 5,382,898 A | 1/1995 | Subramanian |
| 4,906,920 A | 3/1990 | Huff et al. | 5,397,855 A | 3/1995 | Ferlier |
| 4,916,398 A | 4/1990 | Rath | 5,404,111 A | 4/1995 | Mori et al. |
| 4,918,279 A | 4/1990 | Babel et al. | 5,408,189 A | 4/1995 | Swart et al. |
| 4,918,374 A | 4/1990 | Stewart et al. | 5,410,259 A | 4/1995 | Fujihara et al. |
| 4,923,407 A | 5/1990 | Rice et al. | 5,422,574 A | 6/1995 | Kister |
| 4,926,118 A | 5/1990 | O'Connor et al. | 5,434,512 A | 7/1995 | Schwindt et al. |
| 4,933,634 A | 6/1990 | Cuzin et al. | 5,448,172 A | 9/1995 | Dechene et al. |
| 4,968,931 A | 11/1990 | Littlebury et al. | 5,451,884 A | 9/1995 | Sauerland |
| 4,978,907 A | 12/1990 | Smith | 5,457,398 A | 10/1995 | Schwindt et al. |
| 4,978,914 A | 12/1990 | Akimoto et al. | 5,461,328 A | 10/1995 | Devereaux et al. |
| 4,982,153 A | 1/1991 | Collins et al. | 5,469,324 A | 11/1995 | Henderson et al. |
| 4,994,737 A | 2/1991 | Carlton et al. | 5,475,316 A | 12/1995 | Hurley et al. |
| 5,001,423 A | 3/1991 | Abrami et al. | 5,477,011 A | 12/1995 | Singles et al. |
| 5,006,796 A | 4/1991 | Burton et al. | 5,479,108 A | 12/1995 | Cheng |
| 5,010,296 A | 4/1991 | Okada et al. | 5,479,109 A | 12/1995 | Lau et al. |
| 5,019,692 A | 5/1991 | Nbedi et al. | 5,481,936 A | 1/1996 | Yanagisawa |
| 5,030,907 A | 7/1991 | Yih et al. | 5,486,975 A | 1/1996 | Shamouilian et al. |
| 5,034,688 A | 7/1991 | Moulene et al. | 5,488,954 A | 2/1996 | Sleva et al. |
| 5,041,782 A | 8/1991 | Marzan | 5,491,426 A | 2/1996 | Small |
| 5,045,781 A | 9/1991 | Gleason et al. | 5,493,070 A | 2/1996 | Habu |
| 5,061,823 A | 10/1991 | Carroll | 5,493,236 A | 2/1996 | Ishii et al. |
| 5,065,089 A | 11/1991 | Rich | 5,500,606 A | 3/1996 | Holmes |
| 5,065,092 A | 11/1991 | Sigler | 5,506,515 A | 4/1996 | Godshalk et al. |
| 5,066,357 A | 11/1991 | Smyth, Jr. et al. | 5,508,631 A | 4/1996 | Manku et al. |
| 5,070,297 A | 12/1991 | Kwon et al. | 5,510,792 A | 4/1996 | Ono et al. |
| 5,077,523 A | 12/1991 | Blanz | 5,511,010 A | 4/1996 | Burns |
| 5,084,671 A | 1/1992 | Miyata et al. | 5,515,167 A | 5/1996 | Ledger et al. |
| 5,089,774 A | 2/1992 | Nakano | 5,517,111 A | 5/1996 | Shelor |
| 5,091,691 A | 2/1992 | Kamieniecki et al. | 5,521,522 A | 5/1996 | Abe et al. |
| 5,095,891 A | 3/1992 | Reitter | 5,523,694 A | 6/1996 | Cole, Jr. |
| 5,097,207 A | 3/1992 | Blanz | 5,530,371 A | 6/1996 | Perry et al. |
| 5,101,149 A | 3/1992 | Adams et al. | 5,530,372 A | 6/1996 | Lee et al. |
| 5,101,453 A | 3/1992 | Rumbaugh | 5,532,609 A | 7/1996 | Harwood et al. |
| 5,103,169 A | 4/1992 | Heaton et al. | 5,539,323 A | 7/1996 | Davis, Jr. |
| 5,105,148 A | 4/1992 | Lee | 5,546,012 A | 8/1996 | Perry et al. |
| 5,105,181 A | 4/1992 | Ross | 5,550,480 A | 8/1996 | Nelson et al. |
| 5,107,076 A | 4/1992 | Bullock et al. | 5,550,482 A | 8/1996 | Sano |
| 5,142,224 A | 8/1992 | Smith et al. | 5,552,716 A | 9/1996 | Takahashi et al. |
| 5,144,228 A | 9/1992 | Soma et al. | 5,561,377 A | 10/1996 | Strid et al. |
| 5,159,752 A | 11/1992 | Mahant-Shetti et al. | 5,561,585 A | 10/1996 | Barnes et al. |
| 5,160,883 A | 11/1992 | Blanz | 5,565,788 A | 10/1996 | Burr et al. |
| 5,164,661 A | 11/1992 | Jones | 5,571,324 A | 11/1996 | Sago et al. |
| 5,166,606 A | 11/1992 | Blanz | 5,572,398 A | 11/1996 | Federlin et al. |
| 5,172,049 A | 12/1992 | Kiyokawa et al. | 5,583,445 A | 12/1996 | Mullen |
| 5,198,752 A | 3/1993 | Miyata et al. | 5,594,358 A | 1/1997 | Ishikawa et al. |
| 5,198,753 A | 3/1993 | Hamburgen | 5,604,444 A | 2/1997 | Harwood et al. |
| 5,198,756 A | 3/1993 | Jenkins et al. | 5,610,529 A | 3/1997 | Schwindt |
| 5,198,758 A | 3/1993 | Iknaian et al. | 5,611,946 A | 3/1997 | Leong et al. |
| 5,202,558 A | 4/1993 | Barker | 5,617,035 A | 4/1997 | Swapp |
| 5,209,088 A | 5/1993 | Vaks | 5,629,631 A | 5/1997 | Perry et al. |
| 5,210,485 A | 5/1993 | Kreiger et al. | 5,631,571 A | 5/1997 | Spaziani et al. |
| 5,214,243 A | 5/1993 | Johnson | 5,640,101 A | 6/1997 | Kuji et al. |
| 5,214,374 A | 5/1993 | St. Onge | 5,646,538 A | 7/1997 | Lide et al. |
| 5,218,185 A | 6/1993 | Gross | 5,657,394 A | 8/1997 | Schwartz et al. |
| 5,220,277 A | 6/1993 | Reitinger | 5,659,255 A | 8/1997 | Strid et al. |
| 5,221,905 A | 6/1993 | Bhangu et al. | 5,663,653 A | 9/1997 | Schwindt et al. |
| 5,225,037 A | 7/1993 | Elder et al. | 5,666,063 A | 9/1997 | Abercrombie et al. |
| 5,225,796 A | 7/1993 | Williams et al. | 5,668,470 A | 9/1997 | Shelor |
| 5,237,267 A | 8/1993 | Harwood et al. | 5,669,316 A | 9/1997 | Faz et al. |
| 5,266,889 A | 11/1993 | Harwood et al. | 5,670,888 A | 9/1997 | Cheng |
| 5,278,494 A | 1/1994 | Obigane | 5,675,499 A | 10/1997 | Lee et al. |
| 5,280,156 A | 1/1994 | Niori et al. | 5,675,932 A | 10/1997 | Mauney |
| 5,303,938 A | 4/1994 | Miller et al. | 5,676,360 A | 10/1997 | Boucher et al. |
| 5,315,237 A | 5/1994 | Iwakura et al. | 5,680,039 A | 10/1997 | Mochizuki et al. |
| 5,321,352 A | 6/1994 | Takebuchi | 5,682,337 A | 10/1997 | El-Fishaway et al. |
| 5,325,052 A | 6/1994 | Yamashita | 5,685,232 A | 11/1997 | Inoue |
| 5,334,931 A | 8/1994 | Clarke et al. | 5,712,571 A | 1/1998 | O'Donoghue |
| 5,336,989 A | 8/1994 | Hofer | 5,729,150 A | 3/1998 | Schwindt |
| 5,345,170 A | 9/1994 | Schwindt et al. | 5,731,708 A | 3/1998 | Sobhami |

| | | | | | | |
|---|---|---|---|---|---|---|
| 5,773,951 A | 6/1998 | Markowski et al. | | 6,137,303 A | 10/2000 | Deckert et al. |
| 5,777,485 A | 7/1998 | Tanaka et al. | | 6,144,212 A | 11/2000 | Mizuta |
| 5,798,652 A | 8/1998 | Taraci | | 6,147,851 A | 11/2000 | Anderson |
| 5,802,856 A | 9/1998 | Schaper et al. | | 6,160,407 A | 12/2000 | Nikawa |
| 5,804,982 A | 9/1998 | Lo et al. | | 6,194,907 B1 | 2/2001 | Kanao et al. |
| 5,804,983 A | 9/1998 | Nakajima et al. | | 6,198,299 B1 | 3/2001 | Hollman |
| 5,807,107 A | 9/1998 | Bright et al. | | 6,211,663 B1 | 4/2001 | Moulthrop et al. |
| 5,811,751 A | 9/1998 | Leong et al. | | 6,222,970 B1 | 4/2001 | Wach et al. |
| 5,828,225 A | 10/1998 | Obikane et al. | | 6,232,787 B1 | 5/2001 | Lo et al. |
| 5,831,442 A | 11/1998 | Heigl | | 6,232,788 B1 | 5/2001 | Schwindt et al. |
| 5,835,997 A | 11/1998 | Yassine | | 6,232,789 B1 | 5/2001 | Schwindt |
| 5,838,161 A | 11/1998 | Akram et al. | | 6,232,790 B1 | 5/2001 | Bryan et al. |
| 5,847,569 A | 12/1998 | Ho et al. | | 6,236,975 B1 | 5/2001 | Boe et al. |
| 5,848,500 A | 12/1998 | Kirk | | 6,236,977 B1 | 5/2001 | Verba et al. |
| 5,857,667 A | 1/1999 | Lee | | 6,245,692 B1 | 6/2001 | Pearce et al. |
| 5,861,743 A | 1/1999 | Pye et al. | | 6,252,392 B1 | 6/2001 | Peters |
| 5,869,975 A | 2/1999 | Strid et al. | | 6,257,319 B1 | 7/2001 | Kainuma et al. |
| 5,874,361 A | 2/1999 | Collins et al. | | 6,259,261 B1 | 7/2001 | Engelking et al. |
| 5,879,289 A | 3/1999 | Yarush et al. | | 6,271,673 B1 | 8/2001 | Furuta et al. |
| 5,883,522 A | 3/1999 | O'Boyle | | 6,284,971 B1 | 9/2001 | Atalar et al. |
| 5,883,523 A | 3/1999 | Ferland et al. | | 6,288,557 B1 | 9/2001 | Peters et al. |
| 5,892,539 A | 4/1999 | Colvin | | 6,292,760 B1 | 9/2001 | Burns |
| 5,900,737 A | 5/1999 | Graham et al. | | 6,300,775 B1 | 10/2001 | Peach et al. |
| 5,903,143 A | 5/1999 | Mochizuki et al. | | 6,310,755 B1 | 10/2001 | Kholodenko et al. |
| 5,910,727 A | 6/1999 | Fujihara et al. | | 6,313,649 B2 | 11/2001 | Harwood et al. |
| 5,916,689 A | 6/1999 | Collins et al. | | 6,320,372 B1 | 11/2001 | Keller |
| 5,923,177 A | 7/1999 | Wardwell | | 6,320,396 B1 | 11/2001 | Nikawa |
| 5,926,028 A | 7/1999 | Mochizuki | | 6,335,628 B2 | 1/2002 | Schwindt et al. |
| 5,942,907 A | 8/1999 | Chiang | | 6,362,636 B1 | 3/2002 | Peters et al. |
| 5,945,836 A | 8/1999 | Sayre et al. | | 6,380,751 B2 | 4/2002 | Harwood et al. |
| 5,949,579 A | 9/1999 | Baker | | 6,396,296 B1 | 5/2002 | Tarter et al. |
| 5,952,842 A | 9/1999 | Fujimoto | | 6,407,560 B1 | 6/2002 | Walraven et al. |
| 5,959,461 A | 9/1999 | Brown et al. | | 6,424,141 B1 | 7/2002 | Hollman et al. |
| 5,960,411 A | 9/1999 | Hartman et al. | | 6,445,202 B1 | 9/2002 | Cowan et al. |
| 5,963,027 A | 10/1999 | Peters | | 6,480,013 B1 | 11/2002 | Nayler et al. |
| 5,963,364 A | 10/1999 | Leong et al. | | 6,483,327 B1 | 11/2002 | Bruce et al. |
| 5,973,505 A | 10/1999 | Strid et al. | | 6,483,336 B1 | 11/2002 | Harris et al. |
| 5,982,166 A | 11/1999 | Mautz | | 6,486,687 B2 | 11/2002 | Harwood et al. |
| 5,995,914 A | 11/1999 | Cabot | | 6,488,405 B1 | 12/2002 | Eppes et al. |
| 5,998,768 A | 12/1999 | Hunter et al. | | 6,489,789 B2 | 12/2002 | Peters et al. |
| 5,999,268 A | 12/1999 | Yonezawa et al. | | 6,492,822 B2 | 12/2002 | Schwindt et al. |
| 6,001,760 A | 12/1999 | Katsuda et al. | | 6,501,289 B1 | 12/2002 | Takekoshi |
| 6,002,236 A * | 12/1999 | Trant et al. ................. 320/114 | | 6,512,391 B2 | 1/2003 | Cowan et al. |
| 6,002,263 A | 12/1999 | Peters et al. | | 6,515,494 B1 | 2/2003 | Low |
| 6,002,426 A | 12/1999 | Back et al. | | 6,549,022 B1 | 4/2003 | Cole, Jr. et al. |
| 6,013,586 A | 1/2000 | McGhee et al. | | 6,549,026 B1 | 4/2003 | DiBattista et al. |
| 6,023,209 A | 2/2000 | Faulkner et al. | | 6,549,106 B2 | 4/2003 | Martin |
| 6,028,435 A | 2/2000 | Nikawa | | 6,573,702 B2 | 6/2003 | Marcuse et al. |
| 6,029,141 A | 2/2000 | Bezos et al. | | 6,605,951 B1 | 8/2003 | Cowan |
| 6,031,383 A | 2/2000 | Streib et al. | | 6,605,955 B1 | 8/2003 | Costello et al. |
| 6,034,533 A | 3/2000 | Tervo et al. | | 6,608,494 B1 | 8/2003 | Bruce et al. |
| 6,037,785 A | 3/2000 | Higgins | | 6,608,496 B1 | 8/2003 | Strid et al. |
| 6,037,793 A | 3/2000 | Miyazawa et al. | | 6,617,862 B1 | 9/2003 | Bruce |
| 6,043,667 A | 3/2000 | Cadwallader et al. | | 6,621,082 B2 | 9/2003 | Morita et al. |
| 6,049,216 A | 4/2000 | Yang et al. | | 6,624,891 B2 | 9/2003 | Marcus et al. |
| 6,052,653 A | 4/2000 | Mazur et al. | | 6,633,174 B1 | 10/2003 | Satya et al. |
| 6,054,869 A | 4/2000 | Hutton et al. | | 6,636,059 B2 | 10/2003 | Harwood et al. |
| 6,060,888 A | 5/2000 | Blackham et al. | | 6,639,415 B2 | 10/2003 | Peters et al. |
| 6,060,891 A | 5/2000 | Hembree et al. | | 6,642,732 B2 * | 11/2003 | Cowan et al. ............... 324/760 |
| 6,078,183 A | 6/2000 | Cole, Jr. | | 6,643,597 B1 | 11/2003 | Dunsmore |
| 6,091,236 A | 7/2000 | Piety et al. | | 6,686,753 B1 | 2/2004 | Kitahata |
| 6,091,255 A | 7/2000 | Godfrey | | 6,701,265 B2 | 3/2004 | Hill et al. |
| 6,096,567 A | 8/2000 | Kaplan et al. | | 6,710,798 B1 | 3/2004 | Hershel et al. |
| 6,104,203 A | 8/2000 | Costello et al. | | 6,720,782 B2 | 4/2004 | Schwindt et al. |
| 6,111,419 A | 8/2000 | Lefever et al. | | 6,724,205 B1 | 4/2004 | Hayden et al. |
| 6,114,865 A | 9/2000 | Lagowski et al. | | 6,724,928 B1 | 4/2004 | Davis |
| 6,118,894 A | 9/2000 | Schwartz et al. | | 6,734,687 B1 | 5/2004 | Ishitani et al. |
| 6,121,783 A | 9/2000 | Horner et al. | | 6,744,268 B2 | 6/2004 | Hollman |
| 6,124,723 A | 9/2000 | Costello | | 6,771,090 B2 | 8/2004 | Harris et al. |
| 6,124,725 A | 9/2000 | Sato | | 6,771,806 B1 | 8/2004 | Satya et al. |
| 6,127,831 A | 10/2000 | Khoury et al. | | 6,774,651 B1 | 8/2004 | Hembree |
| 6,130,544 A | 10/2000 | Strid et al. | | 6,777,964 B2 | 8/2004 | Navratil et al. |
| 6,137,302 A | 10/2000 | Schwindt | | 6,788,093 B2 | 9/2004 | Aitren et al. |

| | | |
|---|---|---|
| 6,791,344 B2 | 9/2004 | Cook et al. |
| 6,801,047 B2 | 10/2004 | Harwood et al. |
| 6,806,724 B2 | 10/2004 | Hayden et al. |
| 6,836,135 B2 | 12/2004 | Harris et al. |
| 6,838,885 B2 | 1/2005 | Kamitani |
| 6,842,024 B2 | 1/2005 | Peters et al. |
| 6,843,024 B2 | 1/2005 | Nozaki et al. |
| 6,847,219 B1 | 1/2005 | Lesher et al. |
| 6,856,129 B2 | 2/2005 | Thomas et al. |
| 6,861,856 B2 | 3/2005 | Dunklee et al. |
| 6,873,167 B2 | 3/2005 | Goto et al. |
| 6,885,197 B2 | 4/2005 | Harris et al. |
| 6,900,646 B2 | 5/2005 | Kasukabe et al. |
| 6,900,647 B2 | 5/2005 | Yoshida et al. |
| 6,900,652 B2 | 5/2005 | Mazur |
| 6,900,653 B2 | 5/2005 | Yu et al. |
| 6,902,941 B2 | 6/2005 | Sun |
| 6,903,563 B2 | 6/2005 | Yoshida et al. |
| 6,927,079 B1 | 8/2005 | Fyfield |
| 7,001,785 B1 | 2/2006 | Chen |
| 7,002,133 B2 | 2/2006 | Beausoleil et al. |
| 7,002,363 B2 | 2/2006 | Mathieu |
| 7,002,364 B2 | 2/2006 | Kang et al. |
| 7,003,184 B2 | 2/2006 | Ronnekleiv et al. |
| 7,005,842 B2 | 2/2006 | Fink et al. |
| 7,005,868 B2 | 2/2006 | McTigue |
| 7,005,879 B1 | 2/2006 | Robertazzi |
| 7,006,046 B2 | 2/2006 | Aisenbrey |
| 7,007,380 B2 | 3/2006 | Das et al. |
| 7,009,188 B2 | 3/2006 | Wang |
| 7,009,383 B2 | 3/2006 | Harwood et al. |
| 7,009,415 B2 | 3/2006 | Kobayashi et al. |
| 7,011,531 B2 | 3/2006 | Egitto et al. |
| 7,012,425 B2 | 3/2006 | Shoji |
| 7,012,441 B2 | 3/2006 | Chou et al. |
| 7,013,221 B1 | 3/2006 | Friend et al. |
| 7,014,499 B2 | 3/2006 | Yoon |
| 7,015,455 B2 | 3/2006 | Mitsuoka et al. |
| 7,015,689 B2 | 3/2006 | Kasajima et al. |
| 7,015,690 B2 | 3/2006 | Wang et al. |
| 7,015,703 B2 | 3/2006 | Hopkins et al. |
| 7,015,707 B2 | 3/2006 | Cherian |
| 7,015,708 B2 | 3/2006 | Beckous et al. |
| 7,015,709 B2 | 3/2006 | Capps et al. |
| 7,015,710 B2 | 3/2006 | Yoshida et al. |
| 7,015,711 B2 | 3/2006 | Rothaug et al. |
| 7,019,541 B2 | 3/2006 | Kittrell |
| 7,019,544 B1 | 3/2006 | Jacobs et al. |
| 7,020,360 B2 | 3/2006 | Satomura et al. |
| 7,020,363 B2 | 3/2006 | Johannessen |
| 7,022,976 B1 | 4/2006 | Santana, Jr. et al. |
| 7,022,985 B2 | 4/2006 | Knebel et al. |
| 7,023,225 B2 | 4/2006 | Blackwood |
| 7,023,226 B2 | 4/2006 | Okumura et al. |
| 7,023,229 B2 | 4/2006 | Maesaki et al. |
| 7,023,231 B2 | 4/2006 | Howland, Jr. et al. |
| 7,025,628 B2 | 4/2006 | LaMeres et al. |
| 7,026,832 B2 | 4/2006 | Chaya et al. |
| 7,026,833 B2 | 4/2006 | Rincon et al. |
| 7,026,834 B2 | 4/2006 | Hwang |
| 7,026,835 B2 | 4/2006 | Farnworth et al. |
| 7,030,599 B2 | 4/2006 | Douglas |
| 7,032,307 B2 | 4/2006 | Matsunaga et al. |
| 7,034,553 B2 | 4/2006 | Gilboe |
| 7,035,738 B2 | 4/2006 | Matsumoto et al. |
| 7,101,797 B2 | 9/2006 | Yuasa |
| 7,138,813 B2 | 11/2006 | Cowan et al. |
| 2001/0009377 A1 | 7/2001 | Schwindt et al. |
| 2001/0010468 A1 | 8/2001 | Gleason et al. |
| 2001/0020283 A1 | 9/2001 | Sakaguchi |
| 2001/0030549 A1 | 10/2001 | Gleason et al. |
| 2002/0075027 A1 | 6/2002 | Hollman et al. |
| 2002/0118009 A1 | 8/2002 | Hollman et al. |
| 2003/0057513 A1 | 3/2003 | Leedy |
| 2003/0062915 A1 | 4/2003 | Arnold et al. |
| 2003/0071631 A1 | 4/2003 | Alexander |
| 2003/0141861 A1 | 7/2003 | Navratil et al. |
| 2004/0061514 A1 | 4/2004 | Schwindt et al. |
| 2004/0095145 A1 | 5/2004 | Boudiaf et al. |
| 2004/0100276 A1 | 5/2004 | Fanton |
| 2004/0113639 A1 | 6/2004 | Dunklee et al. |
| 2004/0162689 A1 | 8/2004 | Jamneala et al. |
| 2004/0193382 A1 | 9/2004 | Adamian et al. |
| 2004/0199350 A1 | 10/2004 | Blackham et al. |
| 2004/0207424 A1 | 10/2004 | Hollman |
| 2004/0251922 A1 | 12/2004 | Martens et al. |
| 2005/0024069 A1 | 2/2005 | Hayden et al. |
| 2005/0099192 A1 | 5/2005 | Dunklee et al. |
| 2005/0227503 A1 | 10/2005 | Reitinger |
| 2006/0114012 A1 | 6/2006 | Reitinger |
| 2006/0158207 A1 | 7/2006 | Reitinger |

FOREIGN PATENT DOCUMENTS

| | | |
|---|---|---|
| DE | 31 14 466 | 3/1982 |
| DE | 31 25 552 | 11/1982 |
| DE | 41 09 908 | 10/1992 |
| DE | 43 16 111 | 11/1994 |
| DE | 195 41 334 | 9/1996 |
| DE | 196 18 717 | 1/1998 |
| DE | 196 16 212 | 10/1998 |
| EP | 0 087 497 | 9/1983 |
| EP | 0 201 205 | 12/1986 |
| EP | 0 314 481 | 5/1989 |
| EP | 0 333 521 | 9/1989 |
| EP | 0 460 911 | 12/1991 |
| EP | 0 505 981 | 9/1992 |
| EP | 0 574 149 A1 | 5/1993 |
| EP | 0 574 149 | 12/1993 |
| EP | 0 706 210 | 4/1996 |
| EP | 0 573 183 | 1/1999 |
| GB | 2 197 081 | 5/1988 |
| JP | 53-052354 | 5/1978 |
| JP | 56-007439 | 1/1981 |
| JP | 62-011243 | 1/1987 |
| JP | 63-143814 | 6/1988 |
| JP | 1-178872 | 7/1989 |
| JP | 1-165968 | 8/1989 |
| JP | 1-209380 | 8/1989 |
| JP | 1-214038 | 8/1989 |
| JP | 1-219575 | 9/1989 |
| JP | 1-296167 | 11/1989 |
| JP | 2-22837 | 1/1990 |
| JP | 2-22873 | 1/1990 |
| JP | 3-175367 | 7/1991 |
| JP | 4-732 | 1/1992 |
| JP | 5-157790 | 6/1993 |
| JP | 5-166893 | 7/1993 |
| JP | 60-71425 | 3/1994 |
| JP | 7005078 | 1/1995 |
| JP | 10-116866 | 5/1998 |
| JP | 11-031724 | 2/1999 |
| JP | 2001-189285 | 7/2001 |
| JP | 2001-189378 | 7/2001 |
| JP | 2002033374 | 1/2002 |
| JP | 2002-164396 | 6/2002 |
| JP | 2002-164396 | 6/2002 |
| WO | WO 80/00101 | 1/1980 |
| WO | WO 86/07493 | 12/1986 |
| WO | WO 89/04001 | 5/1989 |
| WO | WO 01/69656 | 9/2001 |

WO WO 2004/049395 6/2004

OTHER PUBLICATIONS

John A. Modolo, Gordon Wood Anderson, Francis J. Kub, and Ingham A.G. Mack, "Wafer level high-frequency measurements of photodetector characteristics," Applied Optics, vol. 27, No. 15, Aug. 1, 1988, pp. 3059-3060.
Cascade Microtech, "Introducing the peak of analytical probe stations," MicroProbe Update, May 1990.
H.-J. Eul and B. Schiek, "Thru-Match-Reflect: One Result of a Rigorous Theory for De-Embedding and Network Analyzer Calibration," 18th Euopean Microwave Conference '88, The International Conference Designed for the Microwave Community, Published by Microwave Exhibitions and Publishers Limited, Sep. 12-16, 1988, Stockholm, Sweden.
Cascade Microtech, "Analytical Probe Station," Summit 9000 Series, Jun. 1, 1990.
Maury Microwave Corporation, "MT950D Series, Transistor Test Fixture Software, Software Application Packs," Sep. 20, 1982.
Signatone S-1240 Thermal Controller, 2 page description.
Eric Phizicky, Philippe I.H. Bastiaens, Heng Zhu, Michael Snyder, & Stanley Fields, "Protein analysis on a proteomic scale," Nature 422, insight: review article, Mar. 13, 2003.
The Micromanipulator Company, "Semi-Automatic Probing Stations and Accessories," pp. 1-12.
Integrated Technology Corporation, "Probit PB500A Probe Card Repair and Analysis Station," 4 pages.
Brian J. Clifton, "Precision slotted-Line Impedance Measurements Using computer Simulation for Data Correction," IEEE Transactions on Instrumentation and Measurement, vol. IM-19, No. 4, Nov. 1970, pp. 358-363.
Eric Strid (Cascade Microtech), "Planar Impedance Standards and Accuracy Considerations in Vector Network Analysis," Jun. 1986, 8 pages.
J. Martens, Anritsu Company, 490 Jarvis Drive, Morgan Hill, CA 95037, "Multiport SOLR Calibrations: Performance and an Analysis of some Standards Dependencies," pp. 205-213.
Maury Microwave Corporation, "MT950 Series Transistor Test Fixture (TTF) Notice! Notice! Notice!," May 31, 1985.
Maury Microwave Corporation, MT950 Series Transistor Test Fixture (TTF), Oct. 7, 1982, 4 pages.
Temptronic Corporation, "Model TPO3000 Series ThermoChuck Systems for Probing, Characterization and Failure analysis of Wafers, Chips and Hybrids at High and Low Temperatures," pp. 2-5.
Cascade Microtech, "Model 42/42D Microwave Prove Station Instruction Manual, Electrical Operation," pp. 4-1-4-42.
Inter-Continental Microwave, "Microwave Semiconductor Chip Measurements using the HP 8510B TRL-Calibration Technique," Application Note: 101.
Design Technique, "Microstrip Microwave Test Fixture," May 1986, 2 pages.
PHOTO: Micromanipulator Probe Station 1994.
Micromanipulator Sales and Services Inc., "Test Station Accessories," Copyright 1983, 1984, 1 page.
Ruedi Aebersold & Matthias Mann, "Insight Review Articles, Mass spectrometry-based proteomics," Nature, vol. 422, Mar. 13, 2003, pp. 198-207.
Keithley Instruments, Inc. "Low-Level Measurements for Effective Low Current, Low Voltage, and High Impedance Measurements," Revised Third Edition, Printed Jun. 1984.
Inter-Continental Microwave, 2370-B Walsh Avenue, Santa Clara, CA 95051, "Product Catalog,".
Hewlett Packard, "HP 4284A Precision LCR Meter Operation Manual (Including Option 001,002,006,201,202,301)," Third Edition, Dec. 1991, pp. 2-1, 6-9, 6-15.
Cletus A Hoer, "A High-Power Dual Six-Port Automatic Network Analyzer Used in Determining Biological Effects of RF and Microwave Radiation," IEEE Transactions on Microwave Theory and Techniques, vol. MTT-29, No. 12, Dec. 1981.
Cascade Microtech Technical Brief, A Guide to Better Vector Network Analyzer Calibrations for Probe-Tip Measurements, Copyright 1994, 2 pages.

Temptronic, "Guarded" Chuck Sketch, Nov. 15, 1989.
Arthur Fraser, Reed Gleason, E.W. Strid, "GHz On-Silicon-Wafer Probing Calibration Methods," Cascade Microtech Inc. P.O. Box 1589, Beaverton, OR 97075-1589, pp. 5-8.
Andrej Sali, Robert Glaeser, Thomas Earnest & Wolfgang Baumeister, "From words to literature in structural proteomics," Insight: Review Article, Nature 422, pp. 216-225, Mar. 13, 2003.
Mike Tyers & Matthias Mann, "From genomics to proteomics," Insight overview, Nature vol. 422 Mar. 2003, pp. 193-197.
William Knauer, "Fixturing for Low-Current/Low-Voltage Parametric Testing," Evaluation Engineering, Nov. 1990, pp. 9-12.
J.D. Tompkins, "Evaluating High Speed AC Testers," IBM Technical Disclosure Bulletin, vol. 13, No. 7 Dec. 1970, p. 180.
Jim Fitzpatrick, "Error Models for Systems Measurement," Microwave Journal, May 1978, pp. 63-66.
Sam Hanash, "Disease proteomics," Insight Review Articles, Nature, vol. 422, Mar. 13, 2003, pp. 226-232.
Design Technique International, "Adjustable Test Fixture," Copyright 1988.
Ronald F. Bauer & Paul Penfield, Jr., "De-Embedding and Unterminating," IEEE Transactions on Microwave Theory and Techniques, vol. MTT-22, No. 3, Mar. 1974, pp. 282-288.
Cross Section—Signatone S-1240 Sketch, Advertised & Sold 1987-1988.
Yousuke Yamamoto, "A Compact Self-Shlelding Prober for Accurate Measurement of On-Wafer Electron Devices," IEEE Transactions on Instrumentation and Measurement, vol. 38, No. 6, Dec. 1989, pp. 1088-1093.
R.Y. Koyama & M. G. Buehler, "Semiconductor Measurement Technology: A Wafer Chuck for Use Between -196 and 350° C," U.S. Department of Commerce, National Technical Information Service, PB-293 298, Issued Jan. 1979.
Ken Cole, "ThermoChuck Performance (Fax)," 2 pages, Mar. 10, 1995.
S. Beck & E. Tomann, "Chip Tester," IBM Technical Disclosure Bulletin, Jan. 1985.
Applied Precision, "Checkpoint," 2 pages, 8505 SE 68th Street, Mercer Island, Washington 98040.
L. L. Sohn, O. A. Saleh, G. R. Facer, A. J. Beavis, R. S. Allan, & D. A. Notterman, "Capacitance Cytometry: Measuring biological cells one by one" PNAS vol. 97, No. 20 Sep. 26, 2000, pp. 10687-10690.
Daniel Van Der Weide, "THz Frequency Science & Technology Biomolecular Interaction Sensing with Sub-Terahertz Fields," University of Wisconsin-Madison, 2 pages.
Mark S. Boguski & Martin W. Mcintosh, "Biomedical informatics for proteomics," Insight: review article, Nature 422, Mar. 13, 2003, pp. 233-237.
Saswata Basu & Reed Gleason, "A Membrane Quadrant Probe for R&D Applications," Cascade Microtech, Inc. 14255 SW Brigadoon Ct., Beaverton, OR 97005, 3 pages.
The Micromanipulator Company, Inc., "Model 8000 Test Station," 1986, 1 page.
The Micromanipulator Company, Inc, "Model 8000 Test Station," 1988, 1 page.
"Vacuum," Mechanical Operation, pp. 3-8-3-9.
The Micromanipulator Company, Inc., "Accessories: Hot and Hot/Cold Chucks, Integrated Dry environments, Triaxial chucks, Integrated Shielded and Dark environments, Probe Card Holders," p. 8.
Microwave Products, Microwave Journal, Sep. 1988, 1 page.
Cascade Microtech, "Advanced On-Wafer Device Characterization Using the Summit 10500," pp. 2-20.
Saswata Basu & Leonard Hayden,"An SOLR Calibration for Accurate Measurement of Orthogonal On-Wafer Duts," IEEE MTT-S Digest, 1997, pp. 1335-1336, 1338.
Hewlett Packard, "HP 41428 Modular DC source/Monitor Practical Applications—High Speed DC Characterization of Semiconductor Devices from Sub pA to 1A," Nov. 1987, pp. 1-4.
Doug Rytting, "Appendix to an Analysis of Vector Measurement Accuracy Enhancement Techniques," pp. 1-42, Hewlett Packard.
Temptronic Corporation, "Application Note 1 Controlled Environment Enclosure For low temperature wafer probing in a moisture-free environment," 2 pages.

*Cascade Microtech, Inc.* vs. *Micromanipulator Company, Inc.*, "Deposition of Harry F. Applebay," United States District Court for the District of Oregon, Lead Case No. 97-479-AI.

Flexion Corporation, "Cryotest Station MP-3," *Cascade Microtech, Inc.* vs. *Micromanipulator Company, Inc.*, Applebay Exhibit 576, May 13, 1998, 68 pages.

Flexion Corporation, "Cryotest Station MP-3," *Cascade Microtech, Inc.* vs. *Micromanipulator Company, Inc.*, Applebay Exhibit 578, May 13, 1998, 1 page.

*Cascade Microtech, Inc.* vs. *Micromanipulator Company, Inc.*, Applebay Exhibit 572, May 13, 1998, 2 pages.

*Cascade Microtech, Inc.* vs. *Micromanipulator Company, Inc.*, Applebay Exhibits 581A, 581B, and 581C, May 13, 1998, 3 pages.

Flexion Corporation, "AP-1 Cyrotest Station," Applebay Exhibit 582, May 13, 1998, 20 pages.

Flexion Corporation, "AP-1 Cryotest Station User Manual," Applebay Exhibit 583, May 13, 1998, 187 pages.

*Cascade Microtech, Inc.* vs. *Micromanipulator Company, Inc.*, Applebay Exhibits 577A, 577B, 577C, May 13, 1998, 3 pages.

*Cascade Microtech, Inc.* vs. *Micromanipulator Company, Inc.*, Applebay Exhibits 585, May 13,1998, 7 pages.

* cited by examiner

PROBE STATION THERMAL CHUCK WITH SHIELDING FOR CAPACITIVE CURRENT

CROSS REFERENCE TO RELATED APPLICATIONS

This is a continuation of application Ser. No. 10/626,903, filed Jul. 25, 2003, now U.S. Pat. No. 7,138,813 B2; which is a continuation of application Ser. No. 10/308,847, filed Dec. 2, 2002, now U.S. Pat. No. 6,642,732 B2, issued Nov. 4, 2003; which is a continuation of application Ser. No. 10/179,771, filed Jun. 24, 2002, now U.S. Pat. No. 6,512,391 B2, issued Jan. 28, 2003; which is a continuation of application Ser. No. 09/345,571, filed Jun. 30, 1999, now U.S. Pat. No. 6,445,202, issued Sep. 3, 2002.

BACKGROUND OF THE INVENTION

The present invention is directed to probe stations suitable for making low current and low voltage measurements and, more particularly, to a system for reducing noise due to capacitive currents resulting from the operation of a thermal chuck for a probe station.

Integrated circuit devices are typically manufactured in and on a wafer of semiconductor material using well-known techniques. Prior to cutting the individual integrated circuit devices from a wafer, tests are run on individual devices to determine if the devices operate properly. The wafer is supported on a chuck inside an environmental enclosure in a probe station. Probes are brought into contact with test points or pads on the integrated circuit devices and a series of measurements are performed. Schwindt et al., U.S. Pat. No. 5,663,653, disclose an example of a probe station in which the present invention might be used and the patent is incorporated herein by reference.

Many integrated circuit devices are designed to operate at temperatures other than room temperature. To accommodate device testing at temperatures other than the ambient temperature, a thermal chuck may be employed. One design of a thermal chuck comprises a multilayered chuck for securing a wafer having a thermal driver to modify the temperature of the chuck. A thermal chuck of this design is disclosed by Schwindt in U.S. Pat. No. 5,610,529 which is incorporated herein by reference.

The thermal driver may provide for either heating, cooling, or heating and cooling of the chuck. To modify the temperature of the chuck, the thermal driver may comprise one or more thermal units including a thermal device and a plurality of power conductors connecting the thermal device to a power source. Thermal devices, typically electric resistance heaters or thermoelectric heat pumps, are provided to heat the chuck to temperatures above the ambient temperature. The thermoelectric heat pump, also known as a Peltier device, is reversible and can be used for cooling as well as heating the chuck. The thermoelectric heat pump comprises a number of thermocouples sandwiched between two electrically insulating, thermally conductive plates. When DC power is supplied to the thermocouples, the Peltier effect causes heat to be transferred from one plate to the other. The direction of heat flow is reversible by reversing the direction of current flow in the thermocouples. Exposing the chuck to the warmer plate or the cooler plate of the thermoelectric heat pump will, respectively, either heat or cool the chuck. For testing at temperatures below ambient, the thermal chuck may also include passages for circulating coolant to cool the chuck directly or remove excess heat from the thermoelectric heat pump.

When making the low voltage and low current measurements common to testing integrated circuit devices, even very low levels of electrical noise are unsatisfactory. Thermal chucks include several sources of noise and unacceptably high levels of noise are a common problem when using a thermal chuck. One known source of noise is the result of expansion or contraction of the components of the thermal chuck due to changing temperature. Expansion or contraction changes the spacing between conductive components resulting in the generation of capacitive currents which can reach the conductive surface of the chuck. Expansion or contraction due to temperature change can also cause relative transverse movement between the multiple material layers of the chuck. Relative movement between contacting layers of insulating and conductive materials can generate triboelectric current. In a probe station chuck, the triboelectric current can appear as noise in the test measurements. Triboelectric currents can be reduced by a chuck design which prevents movement between contacting layers of insulating and conducting materials.

The operation of the thermal units by the thermal driver controller is another potential source of noise when using a thermal chuck. To change or maintain the temperature of the thermal chuck, the thermal driver controller fluctuates the electrical power to the thermal units in response to a temperature control system. As a result of the voltage drop within the conductors of the thermal units, physically adjacent portions of the electrical conductors leading to and from, and internal to the thermal devices, will be at different potentials. As the power fluctuates, the difference in voltage between the power conductors changes with time. This results in a displacement of charges in the dielectric material surrounding the conductors which manifests itself as a displacement or capacitive current coupled to the conductive top surface of the chuck. This capacitive current appears as noise in the test measurements.

The currently accepted technique to reduce the effects of capacitive currents involves shielding the chuck from external electromagnetic sources. However, the shielding layers of conductive material in the chuck have proven unsuccessful in eliminating the noise from the thermal driver. To reduce noise due to capacitive currents originating in the thermal chuck, users of probe stations often shut off the thermal units and wait for the current to dissipate. However, the RC time constant involved can be greater than five seconds. Waiting a period of five time constants (e.g. 25 seconds) for the observed noise to dissipate to an acceptable level before making a measurement substantially effects the productivity of the probe station. What is desired, therefore, is a system for reducing the electrical noise generated by the operation of the thermal unit of a probe station's thermal chuck. Reducing noise generated by the thermal chuck reduces the time for the noise to dissipate to acceptable levels improving the productivity of the probe station.

DETAILED DESCRIPTION OF THE PREFERRED EMBODIMENT

Figure 1:
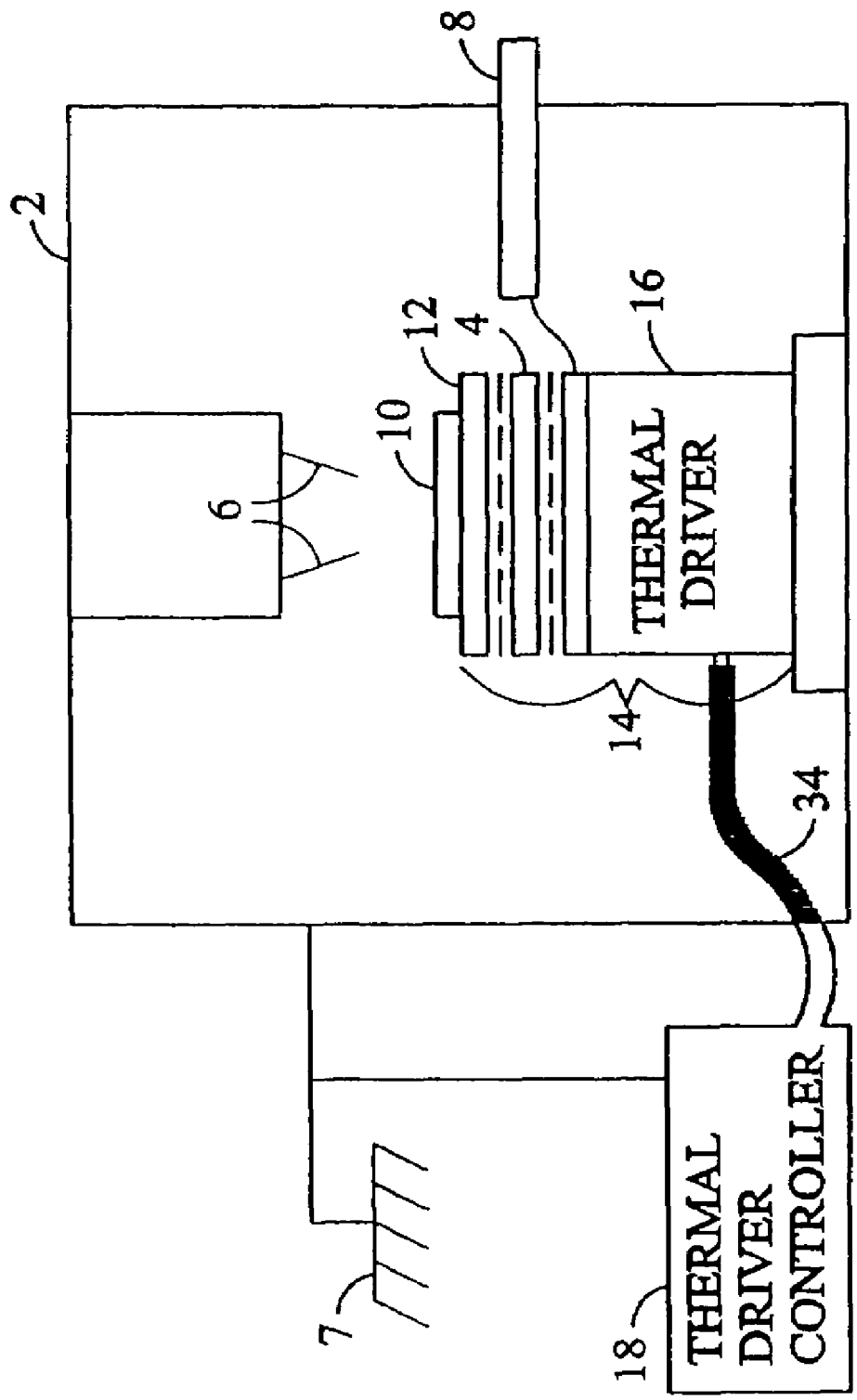
FIG. 1 is a cross-section of a probe station incorporating a thermal chuck.

As illustrated in FIG. 1, a probe station generally includes an environmental enclosure 2 in which is located a chuck 4 and one or more probes 6. The environmental enclosure 2 is typically constructed of a conductive material and grounded 7 so that the chamber, interior to the enclosure 2, is shielded from electromagnetic fields emanating from outside of the enclosure 2. The chuck 4 typically comprises multiple layers of conductive and dielectric materials that are connected to the various conductors of a coaxial or triaxial cable 8. The chuck 4 includes a securement technique for securing a device under test 10, generally a wafer of semiconductor material, to the upper surface 12 of the chuck 4. The upper surface 12 of the chuck 4 is typically conductive. One technique for securing a device under test 10 relies on a vacuum source (not shown) located outside of the environmental enclosure. The vacuum source communicates through appropriate control valves and piping with apertures (not shown) in the upper surface 12 of the chuck 4. When the device under test 10 is placed on the chuck 4 the device blocks apertures leading to the vacuum source. Air pressure holds the device under test 10 against the chuck's upper surface 12. One or more probes 6 can be positioned over the device under test 10 and brought into contact with test pads on the circuit to be tested. Instrumentation connected to the probes 6 measures selected operating parameters of the circuit at the test pads.

Figure 2:
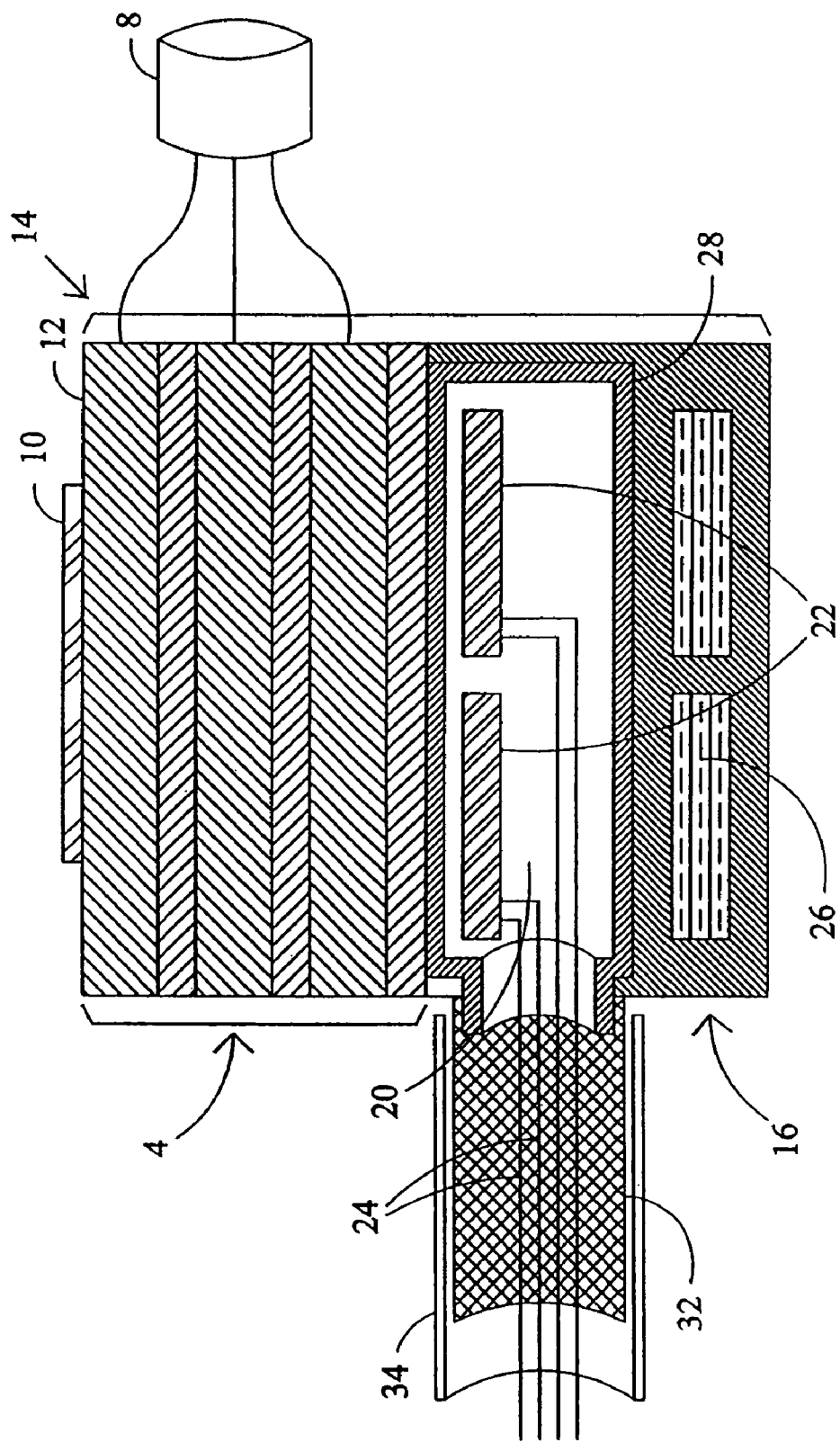
FIG. 2 is a cross section of an exemplary thermal chuck constructed in accordance with the present invention.

A thermal chuck 14, bracketed, may be used to test the operation of devices at temperatures other than the ambient temperature of the environmental enclosure 2. Referring to FIG. 2, the thermal chuck 14, indicated with a bracket, may include a thermal driver 16 having facilities for modifying the temperature of a chuck 4, indicated with a bracket, supported on the top of the thermal driver 16. The thermal driver 16 may be arranged to provide for either heating, cooling, or heating and cooling of the chuck 4. The thermal driver 16 comprises one or more electrically powered thermal units 20 each of which includes one or more thermal devices 22 and a plurality of insulated power conductors 24 connecting the thermal devices 22 to a thermal driver controller 18. Typically, the thermal devices 22 are resistance heaters or thermoelectric heat pumps. Resistance heaters and thermoelectric heat pumps can increase the temperature of the chuck 4. The thermoelectric heat pump can also be used to cool the chuck 4. The thermoelectric heat pump, also known as a Peltier device, comprises a plurality of electrically connected thermocouples of p-type and n-type semiconductor materials sandwiched between two plates of an electrically insulating, thermally conducting material. When DC power is supplied to the thermocouples, heat is transferred from one plate to the other as a result of the Peltier effect. The direction of heat flow is reversible by reversing the direction of current flow in the semiconductors. Exposing the chuck 4 to the warmer plate or the cooler plate of the thermoelectric heat pump will, respectively, heat or cool the chuck 4.

The thermal driver 16 may also include passages 26 for circulating coolant supplied by a coolant source (not shown) typically located outside of the environmental enclosure 2. For testing at temperatures below the ambient temperature, the chuck 4 may be cooled directly by the coolant. If a thermoelectric heat pump is used to cool the chuck, circulating coolant may be necessary to remove heat transferred to the thermal driver 16 by the heat pump.

Electric power for the thermal units 20 is supplied by the thermal driver controller 18 located outside of the environmental enclosure 2. Insulated power conductors 24 transfer the electrical power to the thermal devices 22 in the thermal chuck 14. In response to a temperature sensing system, the thermal driver controller 18 fluctuates the electrical power to the thermal unit 20 to vary its thermal output to either reduce or increase the rate of addition or removal of thermal energy to or from the chuck 4. As a result of the voltage drop in the thermal unit 20, adjacent portions of the insulated power conductors 24 and the conductors inside the thermal devices 22 are at differing potentials. This causes a displacement of charge in the dielectric material surrounding the conductors. As the thermal driver controller 18 fluctuates the power to the thermal unit 20 the difference in voltage between adjacent conductors also varies with time. The present inventors came to the realization that this displacement of charge varying with time causes a displacement or capacitive current which is coupled to the conductive upper surface 12 of the chuck 4. The present inventors further realized that this capacitive current manifests itself as noise in the test measurements.

Figure 3:
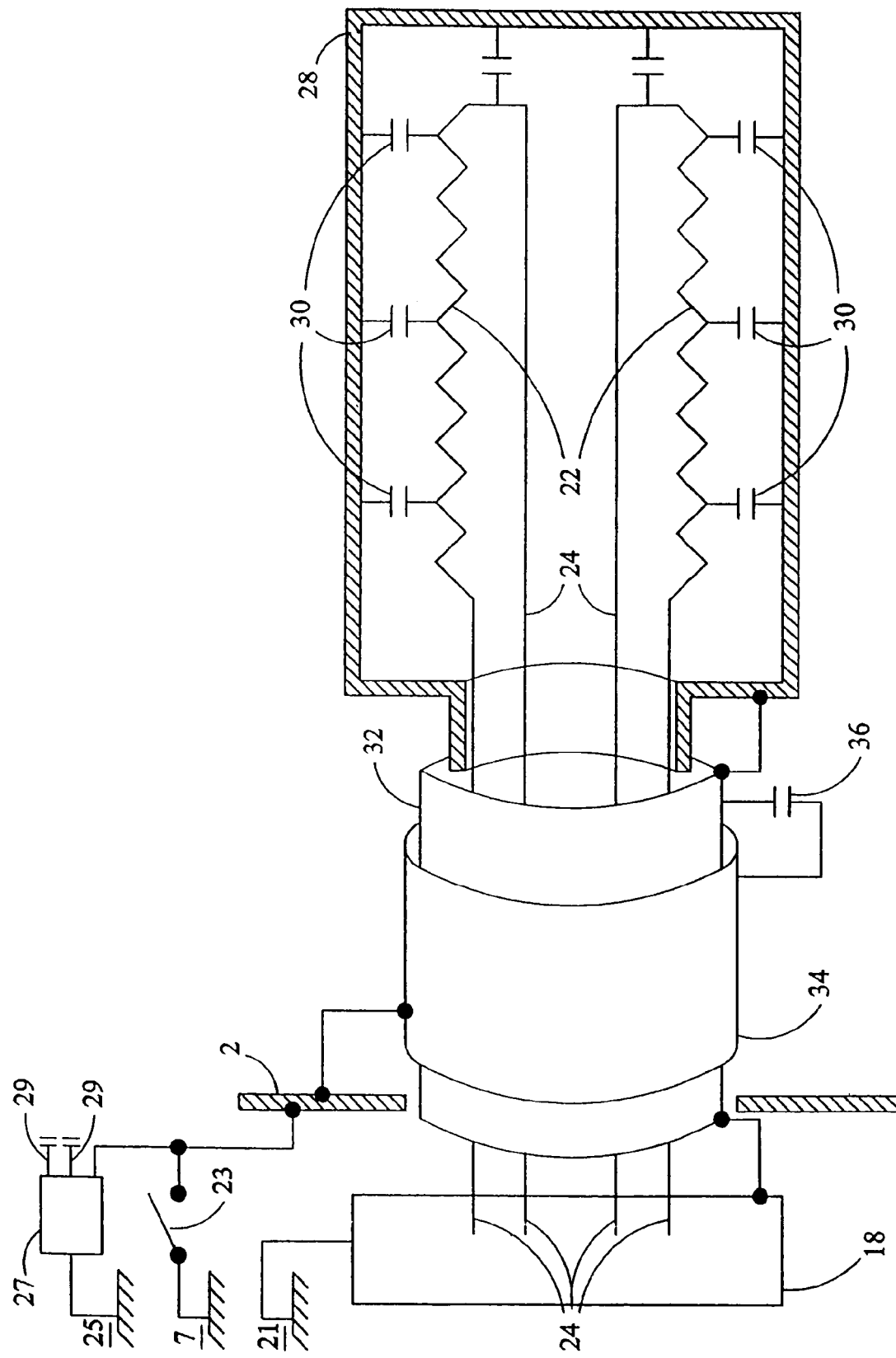
FIG. 3 is an exemplary schematic diagram of a thermal unit and shielding in accordance with a first aspect of a preferred embodiment of the present invention.

The present inventors came to the realization that the aforementioned capacitive currents are a significant source of noise when making measurements in the femtoamp range with state of the art probe stations. The present inventors further realized that conductive shielding of the thermal unit 20 that is capacitively coupled to the conductors of the thermal unit 20 can intercept a substantial amount, and preferably substantially all, of the capacitive currents resulting from the operation of the thermal unit 20 and provide a conductive path to return any current induced in the conductive shielding to the thermal driver controller 18 and to ground. This is in contrast to the presently accepted techniques of adding more shielding to the chuck itself. Referring also to FIG. 3, a conductive thermal device shell 28 substantially encloses the thermal devices 22 and the power conductors 24 at their connection to the thermal devices 22. Variation in charge displacement resulting from the operation of the electric circuit of the thermal device 22 results in a displacement current in the conductive thermal device shell 28. In other words, the thermal device shell 28 is capacitively coupled through "virtual" coupling capacitors 30 to the electric circuit of the thermal device 22 and intercepts capacitive currents that would otherwise find their way to the upper surface 12 of the chuck 4. Although apertures may be required in the thermal device shell 28 they should be minimized in relation to the total surface area of the thermal device shell 28. The more completely the thermal device shell 28 spatially encloses the thermal device 22 the more completely it will intercept capacitive currents emanating from the thermal device 22. The thermal device shell 28 is conductively connected to the thermal driver controller 18 through the conductive shield of the cable 32. The conductive connection of the thermal device shell 28 to the thermal driver controller 18 provides a path for any current in the thermal device shell 28 to exit the environmental enclosure 2 to the thermal driver controller 18. The driver controller 18 is connected to ground 7 extending the conductive return path for capacitive currents to ground 7.

The present inventors also came to the stark realization that by enclosing the thermal devices 22 with a conductive shell 28 the RC time constant of the thermal chuck is dramatically reduced. The thermal devices 22 do not need to be turned off in order for the noise to be sufficiently reduced. The present inventors determined that this reduction in RC time constant is due to a reduction in the stored capacitive charge in the dielectric material within the chuck, referred to as absorption capacitance. The absorption capacitance of a material includes a series resistance so, in effect, it has a memory of previous charges and is slow to dissipate. This absorption capacitance was not previously considered in the design of thermal chucks. There was little, if any, motivation to enclose the thermal devices 22 in a conductive enclosure, as it was believed that noise from the thermal devices 22 could be removed by layers of shielding in the chuck 4. The layers of the chuck 4 include, however, dielectric material which the inventor realized is, in fact, a source of the long RC time constant.

The cable 32 includes the power conductors 24 connecting the thermal driver controller 18 to the thermal devices 22. The shield of the cable 32 ideally extends through the wall of the environmental enclosure 2 and encompasses the power conductors 24 at their entrance into the thermal device shell 28. The shield of the cable 32 is capacitively coupled to the power conductors 24 and will intercept and return to the thermal driver controller 18 currents emanating from the capacitive effects of power fluctuation in the power conductors 24. The thermal driver controller 18 is grounded at ground connection 21. The more complete the enclosure of all conductors in the thermal unit 20 by the conductive shielding, the more complete will be the protection of the test measurement from noise generated by the operation of the thermal unit 20.

The walls of the environmental enclosure 2 are typically conductive material. The conductive material shields the chamber inside the environmental enclosure 2 from electromagnetic (EM) fields originating outside of the enclosure 2 which would otherwise result in noise within the probe 6. The environmental enclosure 2 is grounded to return to ground the currents generated in the conductive wall by the EM fields. In a preferred embodiment of the present invention, the conductive wall of the environmental enclosure is extended to substantially surround parts of the thermal units. The extension of the wall of the enclosure provides a conductive shield capacitively coupled to the thermal units which can return capacitive currents to the enclosure ground.

Referring to FIG. 3, in a first aspect of this preferred embodiment the wall of the environmental enclosure 2 is extended coaxially with yet another shield layer 34 of the cable 32 to a point of close physical proximity to the thermal device shell 28 yet being free from direct electrical connection to the shield of the cable 32, the thermal driver controller 18, and the thermal device shell 28. The wall of the environmental enclosure 2 is extended proximate to the thermal device shell 28 by connecting the outer shield layer 34 of the cable 32 to the wall of the environmental enclosure 2. The cable 32 includes the power conductors 24 connecting the thermal driver controller 18 to the thermal devices 22. Capacitive currents emanating from the power conductors 24 are intercepted by the shield of cable 32 and returned to the thermal driver controller 18 and the thermal driver controller ground 21. The extension of the wall of the environmental enclosure 2 through the outer shield 34 of the power cable 32 is capacitively coupled to the shield of the cable 32 by a "virtual" capacitor 36 and intercepts capacitive currents leaking from within the cable 32 which might otherwise couple to the chuck 4. Any current in the extension of the environmental enclosure 2 is returned to ground 7 outside of the environmental enclosure 2 if switch 23 is closed. If the switch 23 is open, capacitive currents are returned to the ground 25 of an instrument 27 which is connected by leads 29 to probes inside the chamber.

Figure 4:
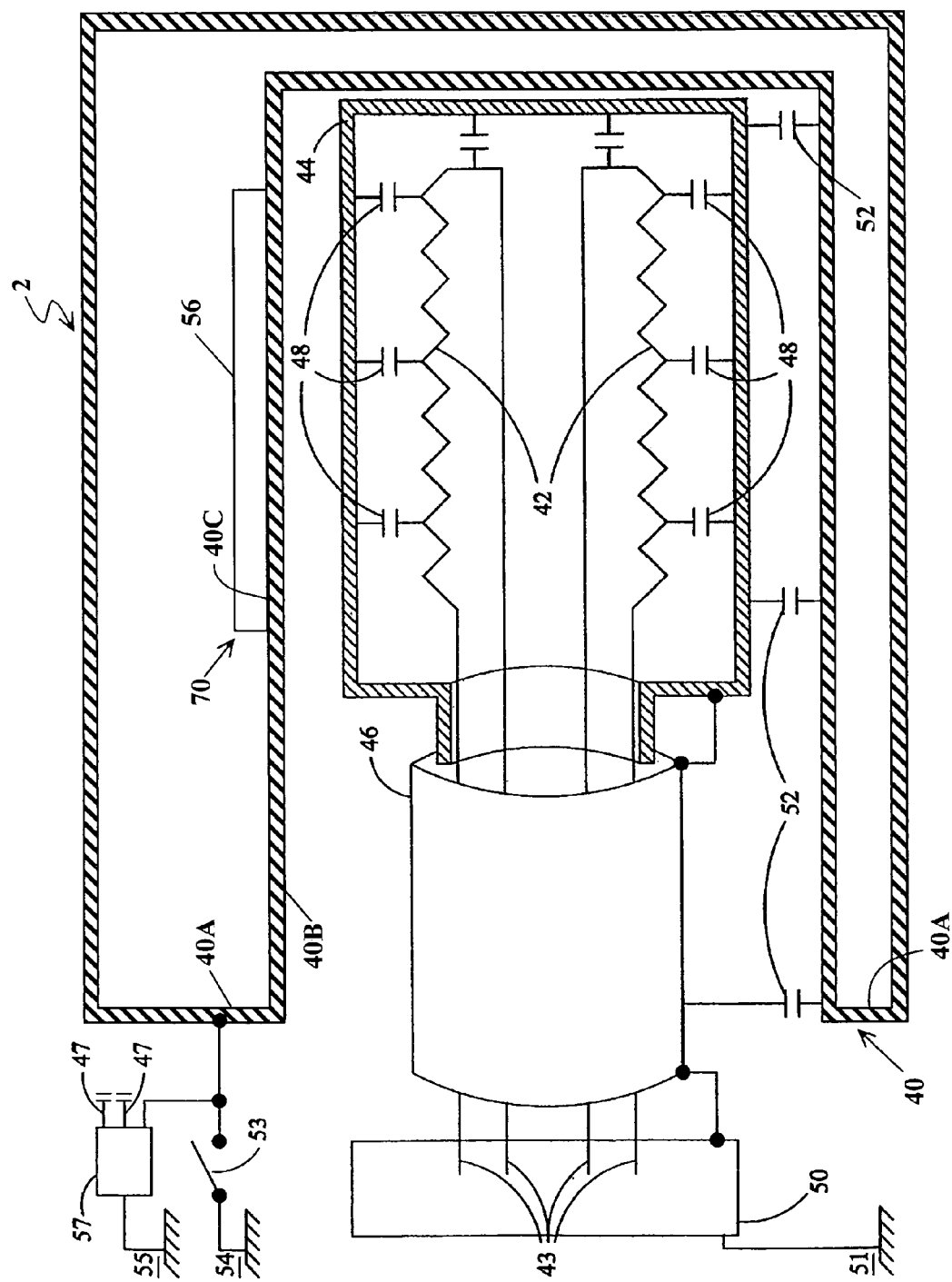
FIG. 4 is an exemplary schematic diagram of a thermal unit and shielding in accordance with a second aspect of a preferred embodiment of the present invention.

Referring to FIG. 4, in a second aspect of this preferred embodiment the wall 40 of the environmental enclosure 2 is extended to substantially surround the thermal devices 42, the thermal device shell 44 and the power cable 46, comprising electrical conductors 43, connecting the thermal devices 42 to the thermal driver controller 50. Heat is transferred to and from the device supporting surface 56 of the chuck 70 through the thermal device shell 44 and the wall of the environmental enclosure 40, which includes an outer surface 40B and inner surface 40A enclosing the chuck and having a portion 40C that separates the device supporting surface of the chuck from the thermal devices 42. The thermal devices 42 are capacitively coupled to the thermal shell 44 by virtual capacitors 48. The thermal device shell 44 and the shield of the power cable 46 are, in turn, capacitively coupled to the wall of the environmental enclosure 40 by virtual coupling capacitors 52. Capacitive currents in the thermal device shell 44 or the shield of the cable 46 are returned to the thermal driver controller 50 through the conductive shield layer of the cable 46. The thermal driver controller 50 is connected to the thermal devices 42 by power conductors 43 and to ground at ground 51. Capacitive currents leaking from the thermal device shell 44 or the power cable 46 will be intercepted by the wall of the enclosure and returned to the enclosure ground 54 when the switch 53 is closed. When the switch 53 is open, capacitive currents in the wall 40 of the environmental enclosure are returned to the ground 55 of the instrument 57. The instrument 57 is connected to the probes 6 inside the environmental enclosure by instrument leads 47.

Figure 5:
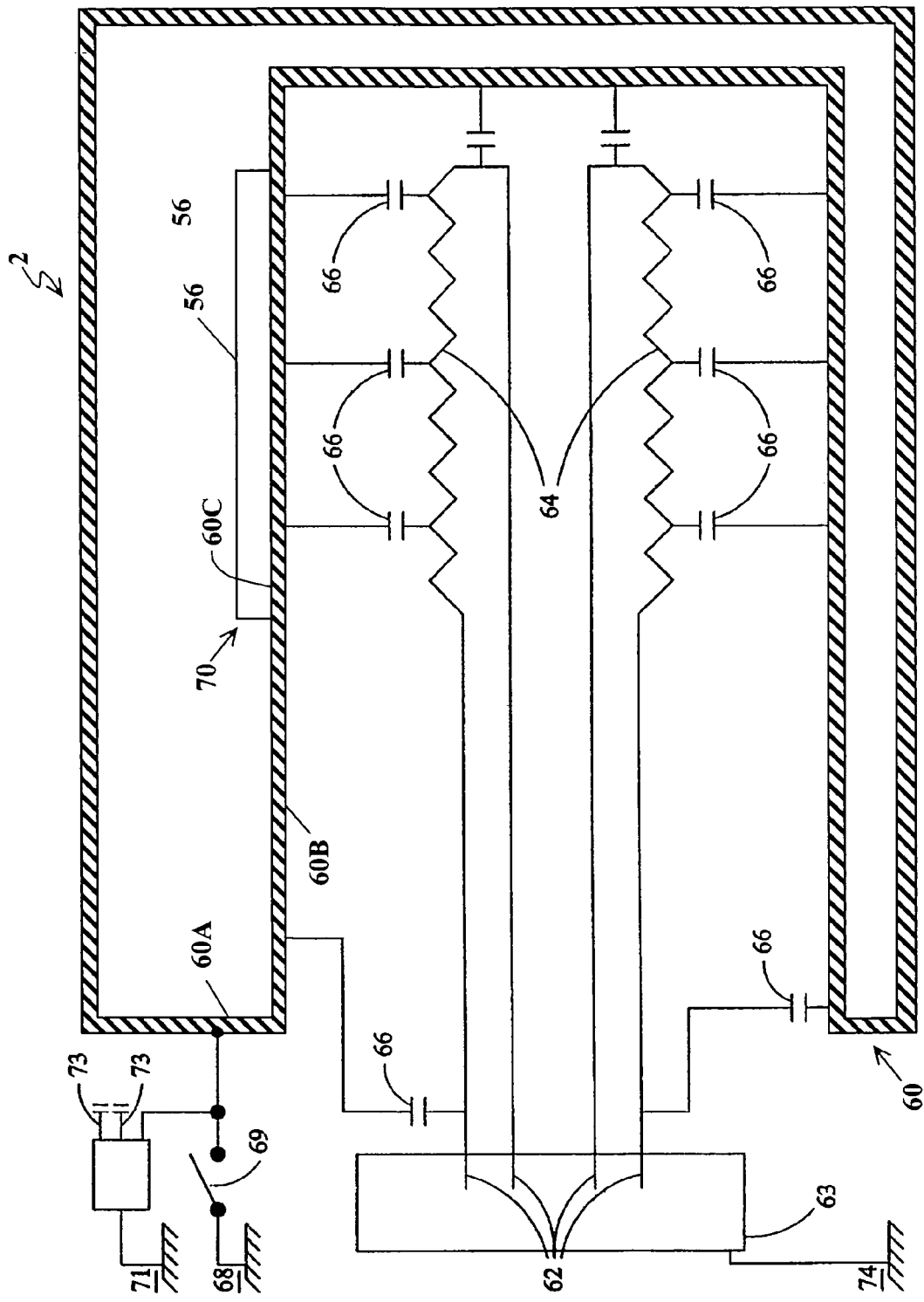
FIG. 5 is an exemplary schematic diagram of a thermal unit and shielding in accordance with a third aspect of a preferred embodiment of the present invention.

Referring to FIG. 5, in a third aspect of this preferred embodiment the wall 60 of the environmental enclosure 2, comprising an inner surface 60A defining the interior of the enclosure and an outer surface 60B, is extended to substantially surround the thermal devices 64 and the power conductors 62 connecting the thermal devices 64 to the thermal driver controller 63. The outer surface 60B of the wall 60 substantially encircles the thermal devices 64 so that portion of the wall including a portion 60C of the inner surface 60A separates the thermal devices from the device supporting surface 56 of the chuck 70. The thermal driver controller is grounded at ground 74. In this aspect of the invention, the thermal devices 64 and the power conductors 62 are capacitively coupled to the wall 60 of the environmental enclosure through the virtual coupling capacitors 66. Capacitive currents generated in the thermal devices 64 or power cables 62 are intercepted by the shield formed by the conductive wall of the enclosure 60 and returned to the enclosure ground 68 when the switch 69 is closed. If the switch 69 is open the walls of the enclosure are grounded through the instrument 73 to the instrument ground 71. Heat is transferred to and from the chuck 70 through the wall 60 of the environmental enclosure.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

We claim:

1. A device for modifying a temperature of a surface of a probe station chuck, said device comprising:

(a) a first conductor conductively connected to a source of an electric current, said electric current producing an increase in a temperature of said first conductor, a difference between said temperature of said first conductor and said temperature of said surface of said probe station chuck modifying said temperature of said surface of said chuck; and (b) a second conductor capacitively connected to said first conductor when current is flowing in said first conductor and conductively connected to a ground, said surface of said probe station chuck separated from a portion of said first conductor by a portion of said second conductor.

2. The device for modifying a temperature of a surface of a probe station chuck of claim 1 wherein a portion of said second conductor substantially encloses a portion of said first conductor.

3. The device for modifying a temperature of a surface of a probe station chuck of claim 1 wherein said source of electric current comprises a connection to a source ground potential and said connection of said second conductor to a ground comprises a conductive connection to said source ground potential.

4. The device for modifying a temperature of a surface of a probe station chuck of claim 1 further comprising a third conductor surrounding a major length of said first conductor and conductively connected to an enclosure substantially surrounding said surface of said probe station chuck.

5. A device for modifying a temperature of a surface of a probe station chuck, said device comprising:

(a) a first conductor conductively connected to a source of an electric current, said electric current producing one of an increase in a temperature of said first conductor and a decrease in said temperature of said first conductor, a difference between said temperature of said first conductor and said temperature of said surface of said probe station chuck modifying said temperature of said surface of said chuck; and (b) a second conductor capacitively connected to said first conductor when current is flowing in said first conductor and conductively connected to a ground, said surface of said probe station chuck separated from a portion of said first conductor by a portion of said second conductor.

6. The device for modifying a temperature of a surface of a probe station chuck of claim 5 wherein a portion of said second conductor substantially encloses a portion of said first conductor.

7. The device for modifying a temperature of a surface of a probe station chuck of claim 5 wherein said source of electric current comprises a connection to a source ground potential and said connection of said second conductor to a ground comprises a conductive connection to said source ground potential said source of electric current.

8. The device for modifying a temperature of a surface of a probe station chuck of claim 5 further comprising a third conductor surrounding a major length of said first conductor and connected to an enclosure substantially surrounding said surface of said probe station chuck.

* * * * *